(12) United States Patent
Sekine et al.

(10) Patent No.: US 6,853,243 B2
(45) Date of Patent: Feb. 8, 2005

(54) WIRELESS COMMUNICATION FREQUENCY SIGNAL AMPLIFICATION APPARATUS AND TRANSMITTING AND RECEIVING APPARATUS

(75) Inventors: Kenji Sekine, Hinode (JP); Tomonori Tanoue, Machida (JP); Osamu Kagaya, Tokyo (JP)

(73) Assignee: Renesas Technology Corporation, Tokyo (JP)

( * ) Notice: Subject to any disclaimer, the term of this patent is extended or adjusted under 35 U.S.C. 154(b) by 0 days.

(21) Appl. No.: 10/222,830

(22) Filed: Aug. 19, 2002

(65) Prior Publication Data

US 2003/0048133 A1 Mar. 13, 2003

(30) Foreign Application Priority Data

Sep. 11, 2001 (JP) ..................... P2001-274503

(51) Int. Cl.⁷ .............. H03F 1/14; H03G 3/20
(52) U.S. Cl. ........................ 330/51; 330/129
(58) Field of Search ............. 330/51, 129, 124 R, 330/286, 295, 124; 327/560, 561

(56) References Cited

U.S. PATENT DOCUMENTS

| | | | | |
|---|---|---|---|---|
| 4,283,684 A | * | 8/1981 | Satoh | .............. 330/277 |
| 4,701,716 A | * | 10/1987 | Poole | .............. 330/43 |
| 5,541,554 A | * | 7/1996 | Stengel et al. | .............. 330/295 |
| 5,684,430 A | * | 11/1997 | Yamamoto | .............. 330/124 R |
| 5,872,481 A | * | 2/1999 | Sevic et al. | .............. 327/295 |
| 5,955,926 A | * | 9/1999 | Uda et al. | .............. 330/295 |
| 6,268,768 B1 | * | 7/2001 | Blodgett | .............. 330/107 |
| 6,640,110 B1 | * | 10/2003 | Shapira et al. | .............. 342/373 |

FOREIGN PATENT DOCUMENTS

| | | |
|---|---|---|
| JP | 07-115331 | 10/1993 |
| JP | 2000-183664 | 12/1998 |

* cited by examiner

Primary Examiner—Dinh T. Le
(74) Attorney, Agent, or Firm—Reed Smith LLP; Stanley P. Fisher, Esq.; Juan Carlos A. Marquez, Esq.

(57) ABSTRACT

To provide a high frequency amplifying apparatus for reducing a phase change caused in switching to a different output level, a variable phase shifter is provided at at least one location of respective paths rearward from a branching circuit for switching a path on a high output side having an amplifier using a first semiconductor device at an output stage and a path on a low output side having an amplifier using a second semiconductor device with a smaller output than the first semiconductor device on an output stage in accordance with a desired output level. After branching and a phase length of the variable phase shifter is set to a pre-determined value such that passing phase lengths of the respective paths become substantially the same by passing either of the paths.

19 Claims, 4 Drawing Sheets

WIRELESS COMMUNICATION FREQUENCY SIGNAL AMPLIFICATION APPARATUS AND TRANSMITTING AND RECEIVING APPARATUS

FIELD OF THE INVENTION

The present invention relates to a high frequency signal amplification apparatus used in a transmitting portion of a transmitting and receiving apparatus for communication, particularly to a high frequency signal power amplifying apparatus preferable by being incorporated into a portable telephone or the like requesting high efficiency operation in either a high output time or a low output time.

BACKGROUND OF THE INVENTION

A mobile communication system having a mobile terminal and a base station for transmitting wireless signals with the mobile terminal has significantly developed centering on a portable telephone system. Above all, a system by a CDMA (Code Division Multiple Access) system is expected to spread worldwide in the future. According to the CDMA system portable telephone system, a portable telephone terminal (mobile terminal) is requested to change transmission power according to communication environment, such as a distance to the base station, behind buildings, or the like. In this case, in either a high output time or a low output time, it requires an amplifying apparatus for a portable telephone terminal constituting a power source of a battery with a high efficiency, i.e., a high ratio of consumption power to transmission power.

Generally, according to a high frequency signal amplification apparatus using a semiconductor device, the larger the output level, the more the efficiency is to be improved. The efficiency becomes the highest at a vicinity requesting the saturated output, i.e., the maximum possible output. The level of the saturated output depends on a size of a semiconductor device. Therefore, an amplifying apparatus with a low saturation level is produced by constituting a small semiconductor device in order to improve the efficiency in a low output time, an output necessary in a high output time is not supported. Further, an amplifying apparatus supports a high efficiency in a high output time with a large semiconductor device, the efficiency is significantly lowered at a low output time.

It is difficult to realize the high efficiency at both of a high output time and a low output time by a single amplifying apparatus. Therefore, an amplifying apparatus adopting a method for preparing semiconductor devices of different sizes for high output and for low output by switching therebetween in accordance with the output level is disclosed in, for example, JP-A-115331/1995.

FIG. 8 shows an example of a conventional amplifying apparatus switching in an output stage in accordance with an output level described in the above-described fabrication. A high frequency signal inputted from a high frequency signal input terminal 301, is inputted to a switching circuit 303 for switching paths via an initial stage amplifier 304 and a second stage amplifier 305 (constituting a driving stage). The switching circuit 303 on an input side and a switching circuit 306 on an output side select any one of a path of (1) only a simple transmission line 307, (2) a path passing through an output stage by one stage of an amplifier 308 and (3) a path passing through an output stage constituted by two stages of amplifiers 309 and 310 to output a high frequency signal to a high frequency signal output terminal 302. When the path of only the simple transmission line 307 is selected, the amplifier 305 becomes an output stage. The output stages of the respective paths are provided with maximum output powers different from each other. Further, a power source to the driving stage amplifiers 304 and 305 is given from a power source circuit 311, and a bias power source for operating only the output stage amplifier of the selected path, is given by a bias power source circuit 312.

According to the above-described conventional technology example, when the output stage is changed by switching the path, a length of a signal path is changed at the respective time. Further, a size of a semiconductor device used and a number of pieces thereof are changed such that the phase of an output signal is significantly changed. According to a simulation and experiments carried out by the inventors, it has been found that when the saturated power on the high output side is set to +30 dBm and the saturated power on the low output side is set to +20 dBm so as to provide an output difference of 10:1, a phase on the side of the high output is shifted by substantially 100 degrees.

According to a respective system of the GSM (Global System for Mobile communication), the PDC (Personal Digital Cellular), the N-CDMA (narrowband-CDMA), or the like adopted in a conventional portable telephone system, a base station uses a decoding system for decoding only a slot at the time point, no problem occurs even when the output stage path is switched and the phase is significantly changed before and after the time point.

However, a W-CDMA (Wideband-CDMA) system of the next generation, with regard to decoding, applies a technology of WMSA (Weighted Multi-Slot Averaging) which takes not only the slot at the current time point but also slots therebefore and thereafter into consideration. Therefore, an inconvenience occurs when the phase is significantly changed before and after switching the paths and accurate decoding cannot be carried out.

It is an object of the invention to provide a high frequency amplifying apparatus capable of reducing a change in a phase caused when the apparatus is switched to a different output level.

SUMMARY OF THE INVENTION

The above-described problem of the invention can effectively be resolved by providing a variable phase shifter at at least one location of respective paths rearward from an input-side branching circuit which is provided for switching between a path on a high output side having an amplifier using a semiconductor device at an output stage thereof and a path on a lower output side having an amplifier using a semiconductor device with a smaller output than the first semiconductor device at an output stage thereof in accordance with a desired output level. A phase length of the variable phase shifter is set to a pre-determined value such that passing phase lengths of the respective paths become substantially the same before and after the switching. By adopting such a configuration, a wireless communication frequency signal amplification apparatus is provided to ensure high efficiency operation in both of high output time and low output time and substantially coincide a phase shift of a wireless communication frequency signal between a high output operation and a low output operation. Further, it has been found that when a phase difference between the high output side and the low output side is made to fall within a range of ±20 degrees, no problem is posed in a decoding system of the W-CDMA system applying the present invention.

Alternatively, the above-described problem of the invention can also effectively be resolved by providing a transmission line at either path to a pre-determined length such that passing phase amounts of the respective paths become substantially the same.

Further, the above-described problem of the invention can also effectively be resolved by providing matching circuits on respective input sides of either path with an inductance connected in parallel and a capacitance connected in series and with a capacitance connected in parallel and an inductance connected in series. Because by constituting both of the matching circuits as described above, both of the matching circuits are provided with phase amounts different from each other such that a phase difference caused by switching the paths is balanced by the different phase amounts.

BRIEF DESCRIPTION OF THE DRAWINGS

The foregoing and additional features and characteristics of the present invention will become more apparent from the following detailed description considered with reference to the accompanying drawings in which like reference numerals designate like elements and wherein.

DETAILED DESCRIPTION OF THE PREFERRED EMBODIMENTS

Figure 1:
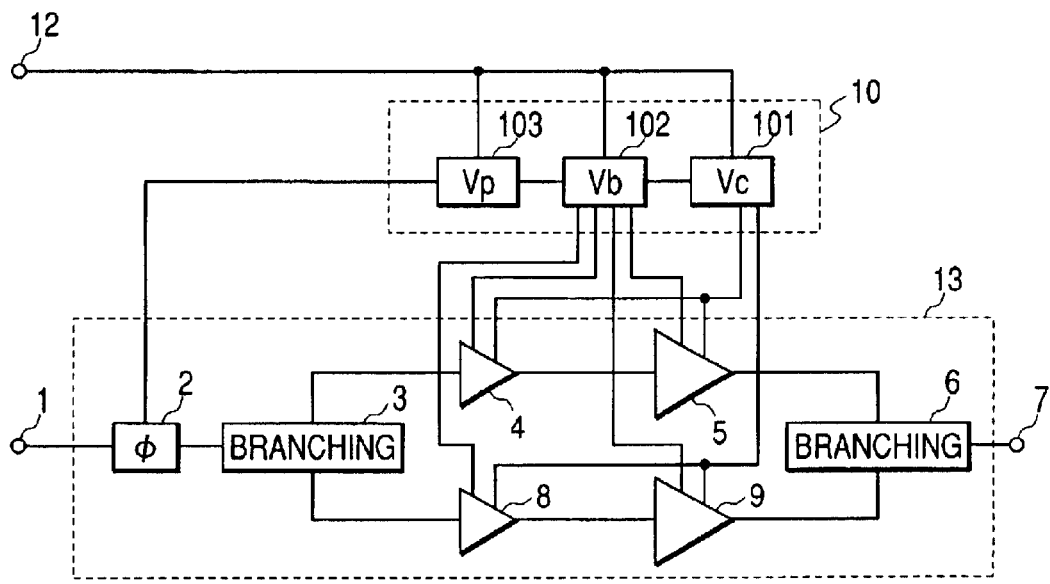
FIG. 1 is a constitution diagram of a first embodiment of a high frequency amplifying apparatus according to the invention.

A detailed explanation is given of a high frequency signal amplification apparatus and a transmitting and receiving apparatus according to the invention in reference to several embodiments of the invention shown in the drawings as follows.

FIG. 1 shows a first embodiment of a high frequency signal amplification apparatus of the invention. The first embodiment is provided with two series including one high output side two stage amplifiers and one low output side two stage amplifiers. In FIG. 1, a high frequency signal circuit portion 13 of the high frequency signal amplification apparatus, is constituted by a variable phase shifter ($\phi$)2 for carrying out phase control with respect to a high frequency signal from a high frequency signal input terminal 1, a branching circuit 3 for branching the signal processed by the variable phase shifter 2 into the two series. The high output side two stage amplifiers comprise an initial stage amplifier 4 and a high output side final stage amplifier 5 for inputting one of branched signals. The low output side two stage amplifiers comprise an initial stage amplifier 8 and a low output side final stage amplifier 9 for inputting the other of the branched signals. A branching circuit 6 for branching output signals of the high output side and the low output side amplifiers thereby outputting the output signals to a high frequency signal output terminal 7. An amplifying device larger than an amplifying device of the low output side final stage amplifier 9 is used for the high output side final stage amplifier 5. A bipolar transistor may be used as the amplifying device in each of the amplifiers. Further, all of the amplifying devices can be mounted to a single semiconductor chip to reduce the size of the high frequency signal amplification apparatus.

Next, a control power source circuit portion 10 of the high frequency signal amplification apparatus is constituted by (1) a phase shifter power source (Vp) 103 for supplying voltage for changing a phase amount, i.e., a passing phase length to the variable phase shifter 2, (2) a base bias source (Vb) 102 for supplying base bias voltage to the respective amplifiers, and (3) a collector voltage source (Vc) 101 for supplying collector voltage to the respective amplifiers. A control signal is given from a control signal terminal 12 to the phase shifter power source 103, the base bias source 102 and the collector voltage source 101 to control a signal processed by the variable phase shifter 2 to pass either one of a high output side or a low output side.

According to the above-described constitution, when the high output side operates, base bias voltages of the amplifiers 3 and 4 are set to pre-determined values and base bias voltages of the amplifiers 8 and 9 on the low output side are set to null. By the setting, the amplifiers 8 and 9 on the low output side are brought into a non-operation state. Further, voltage applied to the phase shifter is set to a value for adjusting the high output side operating time such that the passing phase length becomes a pre-set value.

Further, when the low output side operates, the base bias voltages of the amplifiers 8 and 9 are set to pre-determined values, and the base bias voltages of the amplifiers 4 and 5 on the high output side are set to null. By the setting, the amplifiers 4 and 5 on the high output side are brought into a non-operation state. Further, the voltage applied to the phase shifter is set to a value for adjusting the low output side operating time such that the passing phase length becomes a pre-set value.

The collector voltage of the respective amplifier is set to always be applied to the respective amplifiers of the two paths or to be null simultaneously when the base voltage becomes null.

Further, although according to the embodiment, there is constructed a constitution of the two stages amplifiers both in the high output side/path and the low output side/path, there may be constructed a constitution of a single stage or three stages or more of the amplifiers respectively on each side/path. Further, although the bipolar transistor is used as the semiconductor device of the amplifier, the used semiconductor device is not limited thereto, but may be an FET (Field Effect Transistor), an HEMT (High Electron Mobility Transistor), or the like. In this case, the base bias voltage source 102 is changed to a gate bias voltage source, and the collector voltage source 101 is changed to a drain voltage source.

Figure 2:
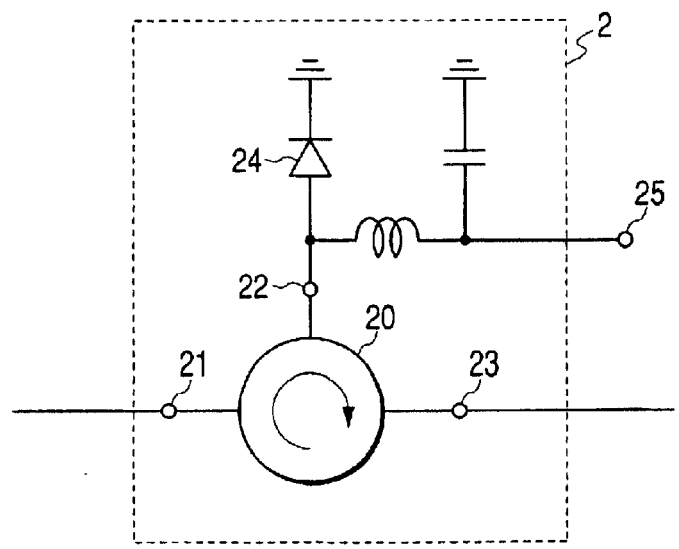
FIG. 2 is a circuit diagram of a variable phase shifter in the high frequency signal amplification apparatus of FIG. 1.

Here, a constitution example of the variable phase shifter 2 is shown in FIG. 2. The high frequency signal from the high frequency signal input terminal 1 is firstly inputted to a first port 21 of a circular 20, reflected by a variable capacitance diode 24 provided frontward from a second port 22 of the circular 20, inputted again to the circulator, and outputted from a third port 23. The variable capacitance diode 24 is applied with a voltage from the phase shifter power source 103 in accordance with the control signal by way of a direct current bias terminal 25. Changing the capacitance of the diode 24 by applying voltage in accordance with the control signal, an equivalent phase length from the first port 21 to the third port 23 is changed.

Further, although according to the embodiment, the position of inserting the variable phase shifter 2 is frontward from the branching circuit 3, a similar effect can be achieved by inserting the variable phase shifter 2 to either one of the high output side/path or the low output side/path rearward from the branching circuit 3.

Figure 3:
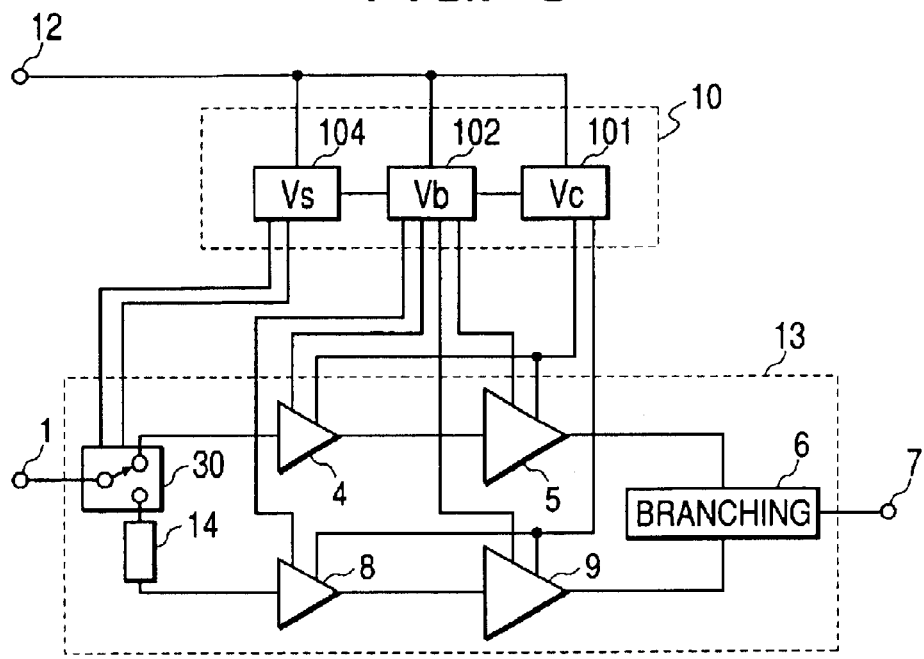
FIG. 3 is a constitution diagram of a second embodiment of a high frequency signal amplification apparatus according to the invention.

FIG. 3 shows a second embodiment of a high frequency signal amplification apparatus according to the invention using a transmission line for phase control. The high frequency signal circuit portion 13 of the high frequency signal amplification apparatus according to the embodiment is constituted by a switching circuit 30 for branching the high frequency signal from the high frequency signal input terminal 1, the high output side two stage amplifiers comprising the initial stage amplifier 4 and the high output side final stage amplifier 5 for inputting one signal branched by the switching circuit 30, a microstrip line 14 having a constant length for inputting the other signal branched by the switching circuit 30, the low output side two stage amplifiers comprising the initial stage amplifier 8 and the low output side final stage amplifier 9 for inputting an output signal of the line 14, and the branching circuit 6 for branching output signals of the high output side and the low output side amplifiers and outputting the output signals to the high frequency signal output terminal 7.

The control power source circuit portion 10 of the high frequency signal amplification apparatus is the same as that of the first embodiment except that there is provided a switching circuit power source (Vs) 104 for supplying voltage for carrying out switching operation to the switching circuit 30 in place of the phase shifter power source 103.

In the above-described constitution, a length of the microstrip line 14 is set to a value for absorbing a difference between passing phase lengths actually measured for the high output side two stage amplifiers and the low output side two stage amplifiers.

Generally, the higher the output of an amplifier, the larger a semiconductor device used in a final stage thereof. Therefore, a large capacitance is added equivalently such that a shift in the phase is increased. By considering the fact, according to the embodiment, the microstrip line 14 is inserted to the low output side. Further, by constituting the branching circuit on the input side by the switching circuit 30 and setting impedance of the microstrip line 14 to 50 Ω, the passing phase on the low output side can be controlled without influence on characteristics of the amplifiers 8 and 9 rearward therefrom other than phases thereof.

Further, although a position of inserting the transmission line is disposed generally on the low output side as in the embodiment, when a phase relationship is reversed by a type of a matching circuit of an amplifier or a semiconductor device, the position may be on the high output side. Further, although there is shown the case of using the microstrip line as the transmission line, depending on a structure of an amplifier, a coplanar line, a coaxial line, or the like may be used.

Figure 4:
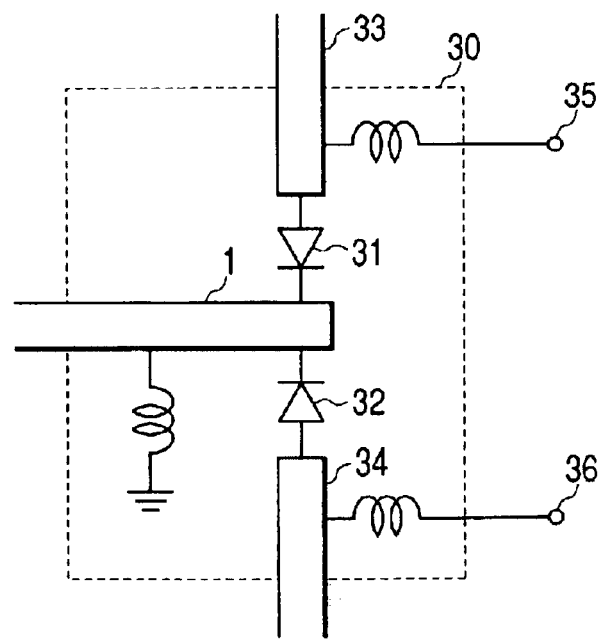
FIG. 4 is a constitution diagram of a switching circuit in the high frequency signal amplification apparatus of FIG. 3.

Here, FIG. 4 shows a constitution example of the switching circuit 30. Pin diodes 31 and 32 are respectively inserted between the high frequency signal input terminal 1 and a transmission line 33 to the high output side and a transmission line 34 to the low output side. The respective diodes are applied with the voltage from the switching circuit power source 104 via power source terminals 35 and 36.

According to the constitution, when the high output side operates, the base voltages of the amplifiers 3 and 4 are set to the pre-determined values and the base voltages of the amplifiers 8 and 9 on the low output side are set to null. By the setting, the amplifiers 8 and 9 on the low output side are brought into the non-operation state. Further, a predetermined voltage is applied from the power source terminal 35 such that the pin diode 31 on the high output side is brought into an ON state.

Further, when the low output side operates, the base voltages of the amplifiers 8 and 9 are set to the pre-determined values and the base voltages of the amplifiers 4 and 5 on the high output side are set to null. By the setting, the amplifiers 4 and 5 on the high output side are brought into the non-operation state. Further, a predetermined voltage is applied from the power source terminal 36 such that the pin diode 32 on the low output side is brought into an ON state.

According to the embodiment, the transmission line is used for phase control so as to realize the high frequency signal amplification apparatus with a simple constitution.

Figure 5:
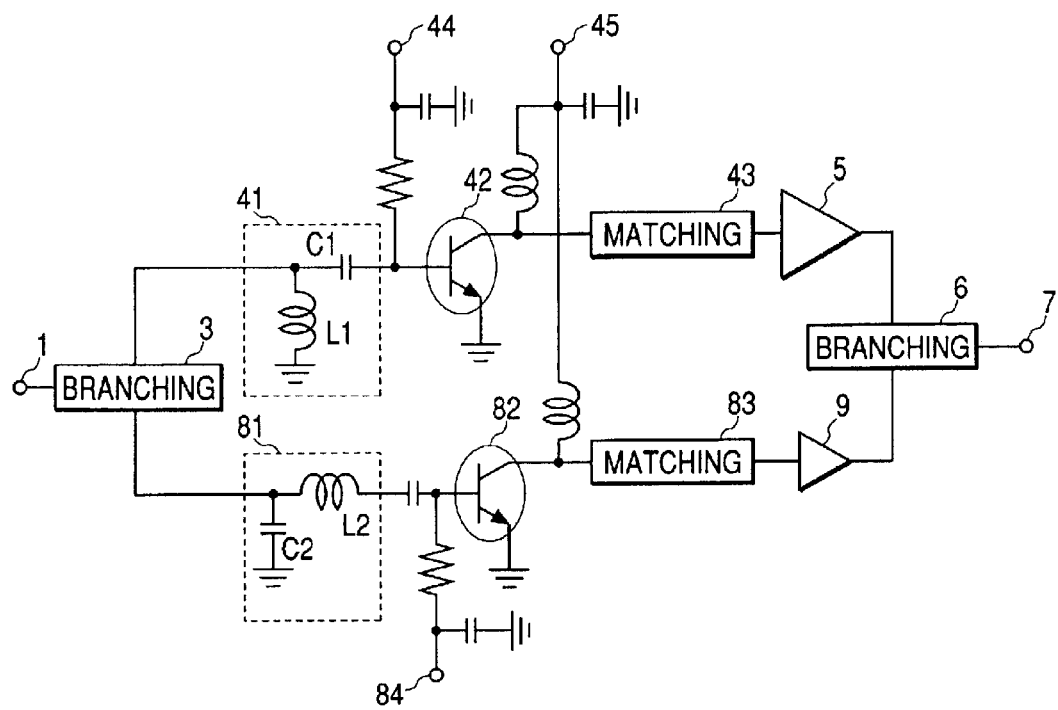
FIG. 5 is a constitution diagram of a third embodiment of a high frequency signal amplification apparatus according to the invention.

FIG. 5 shows a third embodiment of a high frequency signal amplification apparatus according to the invention for carrying out phase control with a matching circuit. In FIG. 5, an input matching circuit 41 of an initial stage amplifier on the high output side and an input matching circuit 81 of an initial amplifier on the low output side are shown by equivalent circuits comprising inductors and capacitors.

In FIG. 5, the matching circuit 41 of the initial stage amplifier on the high output side is constituted by an inductor L1 connected in parallel and a capacitor C1 connected in series and the matching circuit of the initial amplifier on the low output side is constituted by a capacitor C2 connected in parallel and an inductor L2 connected in series. Further, in FIG. 5, numeral 42 designates a semiconductor device of the high output side amplifier, numeral 82 designates a semiconductor device of the low output side amplifier, numeral 43 designates an output side matching circuit of the semiconductor device 42 and numeral 83 designates an output side matching circuit of the initial stage semiconductor device 82.

Figure 6:
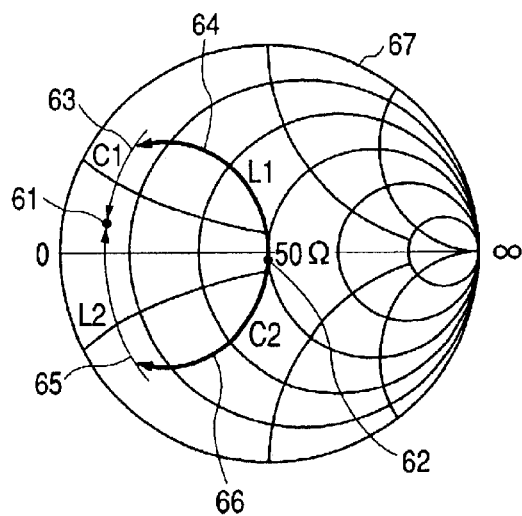
FIG. 6 shows an impedance locus of a matching circuit in the high frequency signal amplification apparatus of FIG. 5.

FIG. 6 shows impedance loci of the matching circuit 41 and the matching circuit 81 reaching matching on a Smith chart. The high output side is firstly moved from an impedance 50 Ω point 62 of the branching circuit 3 on the input side along a locus 64 by the parallel inductance L1 then to a matched load impedance point 61 of the semiconductor device by passing a locus 63 by the series capacitance C1. The low output side is firstly moved along a locus 66 by the parallel capacitance C2 then to the matched load impedance point 61 of the semiconductor device by passing a locus 65 by the series inductance L2. According to the example, sizes of the semiconductor device 42 of the initial stage amplifier on the high output side and the semiconductor device 82 of the initial stage amplifier on the low output side are made the same such that the matched load impedances of both become substantially symmetrical from the perspective of the front end balancing circuit.

As is known from FIG. 6, the impedance loci differ from each other between the high output side and the low output side and therefore, the passing phase length can be changed while satisfying the same matching condition. That is, the matching circuit 41 is constructed by a constitution of a high pass filter and the matching circuit 81 is constructed by a constitution of a low pass filter and therefore, the phase is further shifted on the side of the circuit constitution adopted on the low output side shown in the example than the circuit constitution adopted on the high output side. Therefore, the matching circuits 41 and 81 are operated to cancel that the phase on the high output side is more shifted since a size of a device provided at an output stage is larger on the high output side, and a difference between passing phases on the high output side and the low output side can be reduced.

According to the embodiment, there can be realized the extremely simple, high frequency signal amplification apparatus which does not need to add a variable phase shifter or a transmission line for phase control.

Figure 7:
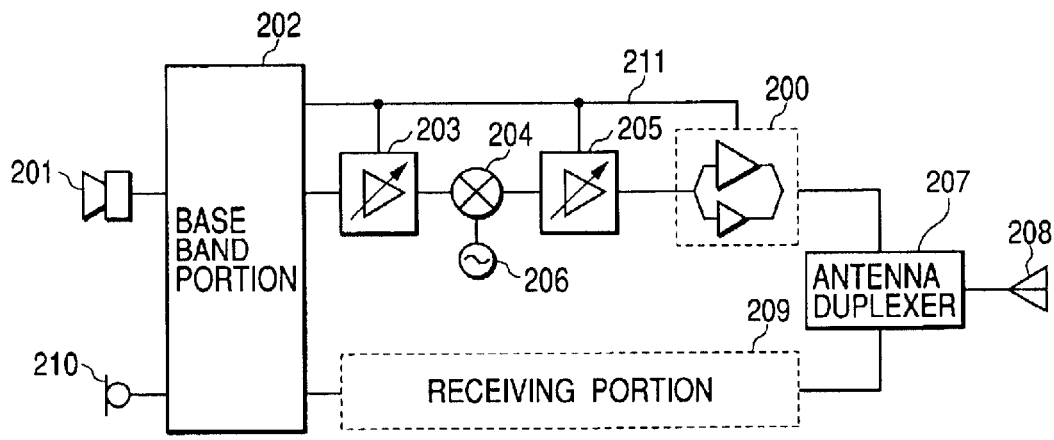
FIG. 7 is a constitution diagram of a mobile terminal applied with a high frequency signal amplification apparatus of the invention.
Figure 8:
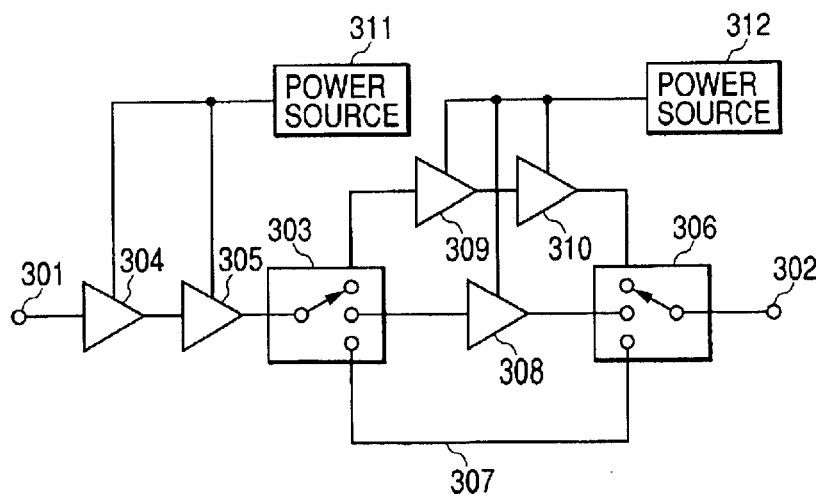
FIG. 8 is a constitution diagram of a conventional high frequency signal amplification apparatus.

FIG. 7 shows an embodiment of the invention of a communication signal transmitting and receiving apparatus including the high frequency amplifying apparatus according to the invention. The transmitting and receiving apparatus is preferable to be incorporated into a portable telephone terminal of a CDMA type portable telephone system.

In FIG. 7, a transmitting side of the transmitting and receiving apparatus is constituted by a base band portion 202 to constitute an intermediate frequency transmission signal by processing a voice signal from a microphone 201, an intermediate frequency signal variable gain amplifier 203 for amplifying the intermediate frequency transmission signal outputted by the base band portion 202, an up converter 204 for converting the intermediate frequency transmission signal outputted by the variable gain amplifier 203 into a high frequency wireless frequency signal, a local oscillator 206 for supplying a carrier signal to the up converter 204, a high frequency signal variable gain amplifier 205 for amplifying the high frequency signal outputted by the up converter 204, a high frequency signal power amplifying apparatus 200 for amplifying the high frequency signal outputted by the high frequency signal variable gain amplifier 205 to a level of a transmitted signal, and an antenna duplexer 207 for supplying the transmitted signal outputted by the high frequency signal power amplifying apparatus 200 to an antenna 208. The high frequency signal amplification apparatus according to the invention is used as the high frequency power amplifying apparatus 200.

Further, a receiving side thereof is provided with a receiving portion 209 for amplifying a received signal processed by the antenna 208 and the antenna duplexer 207 thereby converting the received signal to output an intermediate frequency reception signal, and the base band portion 202 processes the intermediate frequency reception signal into the voice signal and supplies the voice signal to a speaker 210.

According to the constitution, setting of gains of the variable gain amplifiers 203 and 205 and switching of paths of the power amplifying apparatus 200 are carried out by a control signal 211 with the base band portion 202.

The above-described example is preferably applied to the portable telephone terminal for the CDMA system. The application of the invention is not limited thereto but applicable also to a dual mode output terminal dealing with signals of both of, for example, the CDMA system and the GSM system, a dual band portable terminal dealing with two sets of signals having different frequency bands or the like.

According to the invention, even when either path of an amplifying path for the high output and an amplifying path of the low output, is passed, the passing phase length of the respective path can be made substantially the same. Thereby, there the high frequency amplifying apparatus is capable of amplifying with high efficiency with both the high output and the low output and substantially making the phase of the high frequency signal at the high output time and the phase of the high frequency signal at the low output time coincide to each other. In a portable telephone terminal of the CDMA system or the like, low power consumption can be achieved and an error in decoding a signal can be suppressed to be small. Further, phase control can also be carried out by a transmission line or a passive circuit of an inductance, a capacitance or the like without using a phase shifter so as to realize the high frequency signal amplification apparatus which is small, cost-effective and suitable for mass production since the constitution of the total of the amplifying apparatus is simplified.

The principles, preferred embodiments and modes of operation of the present invention have been described in the foregoing specification. However, the invention which is intended to be protected is not limited to the particular embodiments disclosed. The embodiments described herein are illustrative rather than restrictive. Variations and changes may be made by others, and equivalents employed, without departing from the spirit of the present invention. Accordingly, it is expressly intended that all such variations, changes and equivalents which fall within the spirit and scope of the present invention as defined in the claims, be embraced thereby.

What is claimed is:

1. A wireless communication frequency signal amplification apparatus, comprising:

a first path having at least one amplifier having a first semiconductor device at an output stage thereof;

a second path having an output lower than that of the first path, and the second path having at least one amplifier having a second semiconductor device formed to accomodate a smaller output than an output of the first semiconductor device at an output stage thereof;

a control circuit to control the paths so that the paths are operative one at a time; a branching circuit on an input side and a branching circuit on an output side of the paths for branching an input signal into an operative one of the paths in accordance with a desired output level of the apparatus; and a phase adjuster for adjusting a phase of the signal so that signal so that the phase of the signal through the first path when the first path is operative becomes substantially the same as the phase of the signal though the second path when the second path is operative.

2. The wireless communication frequency signal amplification apparatus according to claim 1, wherein the phase adjuster includes at least one phase shifter provided frontward from the input-side branching circuit on the paths.

3. The wireless communication frequency signal amplification apparatus according to claim 1, wherein the phase adjuster includes at least one transmission line provided on the paths.

4. The wireless communication frequency signal amplification apparatus according to claim 1, wherein the phase adjuster includes at least one matching circuit provided on the paths.

5. The wireless communication frequency signal amplification apparatus according to claim 2, wherein the phase shifter is a variable phase shifter.

6. The wireless communication frequency signal amplification apparatus according to claim 3, wherein the transmission line is arranged on the second path with a line impedance of 50 $\Omega$.

7. The wireless communication frequency signal amplification apparatus according to claim 4, wherein the matching circuit is constituted by an inductance connected in parallel and a capacitance connected in series with the paths.

8. The wireless communication frequency signal amplification apparatus according to claim 4, wherein the matching circuit is constituted by a capacitance connected in parallel and an inductance connected in series with the paths.

9. The wireless communication frequency signal amplification apparatus according to claim 4, wherein said at least one matching circuit include a first matching circuit provided on the first path and constituted by an inductance connected in parallel and a capacitance connected in series with the first path, and a second matching circuit provided on the second path and constituted by a capacitance connected in parallel and an inductance connected in series with the second path.

10. The wireless communication frequency signal amplification apparatus according to claim 1, wherein the amplifier of one of the paths is brought into a non-operation state when the other one of the paths and the amplifier thereof are switched on.

11. The wireless communication frequency signal amplification apparatus according to claim 1, wherein the first semiconductor device and the second semiconductor device are mounted on a single semiconductor chip.

12. The wireless communication frequency signal amplification apparatus according to claim 1, wherein the wireless frequency signal is transmitted and received via a CDMA system.

13. The wireless communication frequency signal amplification apparatus according to claim 12, wherein the CDMA system applies a weighted multi-slot averaging technique for decoding.

14. A communication signal transmitting and receiving apparatus, comprising:
a first up converter electrically connected to an output of a base band portion for converting a base band signal from the base band portion into an intermediary frequency signal;
an second up converter electrically connected to an output of the first up converter for converting the intermediary signal from the first up converter into a wireless frequency signal and vice versa;
a first down converter electrically connected to an antenna for converting the wireless frequency signal from the antenna into an intermediary frequency signal;
a second down converter electrically connected between an output of the first down converter and an input of the base band portion for converting the intermediary frequency signal from the first down converter into a base signal to be inputted into the base band portion;
an amplifying device electrically connected between an output of the second up converter and the antenna for amplifying the wireless frequency signal from the second up converter to be sent to or received from an antenna, comprising:
a first path having at least one amplifier having a first semiconductor device at an output stage thereof;
a second path having an output lower than that of the first path, and the second path having at least one amplifier having a second semiconductor device formed to accommodate a smaller output than an output of the first semiconductor device at an output stage thereof;
a control circuit to control the paths so that the paths are operative one at a time;
a branching circuit on an input side and a branching circuit on an output side of the paths for branching an input signal into an operative one of the paths in accordance with a desired output level of the apparatus; and
a phase adjuster for adjusting a phase of the signal so that the phase of the signal through the first path when the first path is operative becomes substantially the same as the phase of the signal through the second path when the second path is operative.

15. The communication signal transmitting and receiving apparatus according to claim 14, wherein the wireless frequency signal is transmitted and received via a CDMA system.

16. The communication signal transmitting and receiving apparatus according to claim 15, wherein the CDMA system applies a weighted multi-slot averaging technique for decoding.

17. A dual-band and/or dual-mode portable communication terminal including two sets of communication signal transmitting and receiving apparatus, each of which comprising:
a first up converter electrically connected to an output of a base band portion for converting a base band signal from the baaase band portion into an intermediary frequency signal and vice versa;
an second up converter electrically connected to an output of the first up converter for converting the intermediary signal from the first up converter into a wireless frequency signal and vice versa;
a first down converter electrically connected to an antenna for converting the wireless frequency signal from the antenna into an intermediary frequency signal;
a second down converter electrically connected between an output of the first down converter and an input of the base band portion for converting the intermediary frequency signal from the first down converter into a base band signal to be inputted into the base band portion;
an amplifying device electrically connected between an output of the second up converter and the antenna for amplifying the wireless frequency signal from the second up converter to be sent to or received from an antenna, comprising:
a first path having at least one amplifier having a first semiconductor device at an output stage thereof;
a second path having an output lower than that of the first path, and the second path having at least one amplifier having a second semiconductor device formed to accommodate a smaller output than an output of the first semiconductor device at an output stage thereof;
a control circuit to control the paths so that the paths are operative one at a time;
a branching circuit on an input side of the paths and a branching circuit on an output side of the paths for branching an input signal into an operative one of the paths in accordance with a desired output level of the apparatus; and
a phase adjuster for adjusting a phase of the signal so that phase of the signal through the first path when the first path is operative becomes substantially the same as the phase of the signal through the second path when the second path is operative.

18. The dual-band and/or dual-mode portable communication terminal according to claim 17, wherein the wireless frequency signal is transmitted and received at least via a CDMA system.

19. The dual-band and/or dual-mode portable communication terminal according to claim 18, wherein the CDMA system applies a weighted multi-slot averaging technique for decoding.

* * * * *